United States Patent
Gupta et al.

(10) Patent No.: US 6,490,716 B1
(45) Date of Patent: Dec. 3, 2002

(54) AUTOMATED DESIGN OF PROCESSOR INSTRUCTION UNITS

(75) Inventors: Shail Aditya Gupta, Sunnyvale, CA (US); B. Ramakrishna Rau, Los Altos, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,394

(22) Filed: Aug. 20, 1999

(51) Int. Cl.$^7$ ................................................ G06F 17/50
(52) U.S. Cl. ........................................ 716/18; 716/17
(58) Field of Search .................. 716/1–21; 708/819; 711/149; 712/23, 24, 201, 218, 209, 227; 365/45, 102, 183, 222, 230.05; 333/165; 235/460

(56) References Cited

U.S. PATENT DOCUMENTS

| 4,322,819 A | * | 3/1982 | Hyatt | 365/45 |
| 6,226,776 B1 | | 5/2001 | Panchul | 716/3 |
| 6,279,100 B1 | * | 8/2001 | Tremblay et al. | 712/24 |

OTHER PUBLICATIONS

Aditya et al., "Elcor's Machine Description System: Version 3.0," HPL–98–128, Oct. 1998, pp. 1–75.
Rau et al., "Machine–Description Driven Compilers for EPIC Processors," HP Laboratories Technical Report, HPL–98–40, Sep. 1998, pp. 1–82.
Kathail et al., "HPL PlayDoh Architecture Specification: Version 1.0," HP Laboratories Technical Report, HPL–93–80, Feb. 1994, pp. 1–48.
Rainer Leupers, Peter Marwedel, "Retargetable Generation of Code Selectors from HDL Processor Models," IEEE, 1997, pp. 140–144.
George Hadjiyiannis, Silvina Hanono, Srinivas Devadas, "ISDL: An Instruction Set Description Language for Retargetability," ACM, 1997, pp. 299–302.
Gyllenhaal et al., "HMDES Version 2.0 Specification," Hewlett Packard Laboratories Technical Report IMPACT–96–3,.
Hadjiyiannis et al., "A Methodology for Accurate Performance Evaluation in Architecture Exploration."
Hoogerbrugge et al., "Automatic Synthesis of Transport Triggered Processors."
Corporaal et al., "MOVE: A Framework for High–Performance Processor Design," ACM, 1991, pp. 692–701.
Corporaal et al., "Cosynthesis with the MOVE Framework."
Lanneer et al, "Chapter 5—Chess: Retargetable Code Generation for Embedded DSP Processors," *Code Generation for Embedded Processors*, Kluwer Academic Publications, pp. 85–102.
Fauth, "Chapter 8—Beyond Tool-Specific Machine Descriptions," *Code Generation for Embedded Processors*, Kluwer Academic Publications, pp. 138–152.

* cited by examiner

*Primary Examiner*—Matthew Smith
*Assistant Examiner*—Naum Levin

(57) ABSTRACT

An automated method for designing a processor's control path employs program routines that synthesize the control path based on the processor's instruction format and data path specification. It extracts parameters from a machine-readable description of the processor's instruction format, and generates a specification of the components in the control path and their interconnection with the control ports in the data path.

9 Claims, 7 Drawing Sheets

AUTOMATED DESIGN OF PROCESSOR INSTRUCTION UNITS

RELATED APPLICATION DATA

This patent application is related to the following co-pending U.S. Patent applications, commonly assigned and filed concurrently with this application:

U.S. patent application Ser. No. 09/378,596, entitled AUTOMATIC DESIGN OF PROCESSOR DATAPATHS, by Shail Aditya Gupta and Bantwal Ramakrishna Rau (referred to as the Datapath Application);

U.S. patent application Ser. No. 09/378,293, entitled AUTOMATIC DESIGN OF VLIW INSTRUCTION FORMATS, by Shail Aditya Gupta, Bantwal Ramakrishna Rau, Richard Craig Johnson, and Michael S. Schlansker, and (referred to as the Instruction Format Application);

U.S. patent application Ser. No. 09/378,601, entitled PROGRAMMATIC SYNTHESIS OF A MACHINE DESCRIPTION FOR RETARGETING A COMPILER, by Shail Aditya Gupta (referred to as the MDES Extractor Application);

U.S. patent application Ser. No. 09/378,395, entitled AUTOMATIC DESIGN OF VLIW PROCESSORS, by Shail Aditya Gupta, Bantwal Ramakrishna Rau, Vinod Kumar Kathail, and Michael S. Schlansker, and;

U.S. patent application Ser. No. 09/378,290, entitled AUTOMATED DESIGN OF PROCESSOR SYSTEMS USING FEEDBACK FROM INTERNAL MEASUREMENTS OF CANDIDATE SYSTEMS, by Michael S. Schlansker, Vinod Kumar Kathail, Greg Snider, Shail Aditya Gupta, Scott A. Mahlke, and Santosh G. Abraham.

The above patent applications are hereby incorporated by reference.

TECHNICAL FIELD

The invention relates to the automated design of a programmable processor, and in particular, relates to the design of a processor instruction unit.

BACKGROUND

Over the last decade, the use of programmable processors has become pervasive, not only in conventional computing machines such as workstations and PCs, but also in a variety of other products such as telephones, games, vehicles, televisions, etc. While workstations and personal computer markets are converging on a small number of processor designs, the embedded systems market is enjoying an explosion of architectural diversity. This diversity is driven by widely varying demands on processor performance and power consumption, and is propelled by the possibility of optimizing architectures for particular application domains. Because of these varying demands and the advantages of optimizing a design for a particular application, it is often necessary to design an application specific processor rather than use an existing processor design. In view of the complexity of the design task and the pressure to reduce the time to market, there is a need for automation tools that assist the designer in creating the processor design.

The processor design generally includes a specification of the instruction format, a data path, and a control path. The instruction format specifies the instructions that the processor executes along with the specific bit encodings for each of the instructions. The data path specifies the functional units that execute the instructions, the register files that store the inputs and outputs of the instructions, and the interconnect that transfers data back and forth between the register files and functional units. Finally, the control path specifies how instructions are fetched from memory, decoded, and dispatched to the control ports in the data path, including the register file address ports and opcode input ports of the functional units.

An instruction unit is a general term for the control path component in the processor that fetches instructions from memory and decodes them. The design of the instruction unit is typically quite complex, particularly for Very Long Word Instruction (VLIW) processors. VLIW processors exploit instruction-level parallelism by issuing several operations per instruction to multiple functional units. Usually, the instructions are very wide and of variable width in order to minimize code size. The encoding of multiple operations into variable length instructions complicates the design of the instruction unit.

To date, the architects of programmable processor chips have had to design the instruction unit of the processor manually. While there are a number of software tools for digital logic synthesis, none of these tools are known to automate the design of the processor instruction unit. Therefore, there is a need for design tools that automate the design of instruction units, and their components.

SUMMARY

The invention relates to an automated method for designing a processor's control path. The method employs program routines implemented in software or hardware to automate the design of the control path based on the processor's instruction format and data path specification. It extracts parameters from a machine-readable description of the processor's instruction format specification, and generates a specification of the components in the control path.

The method involves a number of unique process steps for automating the design of a processor's control path. These process steps may be used individually, or in a variety of combinations, to automate the design of components in the processor's control path. In one design scenario, for example, the method generates a hardware description of the processor's control path from a specification of the processor's instruction format and a macrocell library of hardware components used to build the components in the control path. In this scenario, the processor's control path includes: 1) the data path (the IUdatapath) of an instruction from the processor's instruction cache to an instruction register that interfaces with the instruction decode logic, 2) the control logic for controlling the IUdatapath, and 3) the instruction decode logic. The method programmatically extracts instruction width requirements from the instruction format and uses this information to create macrocell instances for the hardware components in the IUdatapath. It also programmatically generates the decode logic (e.g., in the form of logic tables) from the instruction format specification. Finally, it programmatically generates the control logic for the IUdatapath. This control logic includes the logic that interconnects the instruction sequencer in the processor with the IUdatapath and controls an alignment network for aligning instructions in the processor's instruction register.

Each one of the process steps outlined above can be used individually to automate portions of the control path design. For example, one aspect of the method may be used to generate a hardware description of prefetch buffers in the control path based on the instruction format. Another aspect of the method may be used to generate the control logic that controls the prefetch buffers and interconnects the instruction sequencer in the processor with the IUdatapath. Yet another aspect of the method may be used to generate the alignment network. Finally, another aspect of the method may be used to generate the control logic that decodes the instructions and distributes the control signals to the processor's data path components.

Further advantages and features of the invention will become apparent with reference to the following detailed description and accompanying drawings.

DETAILED DESCRIPTION

Figure 1:
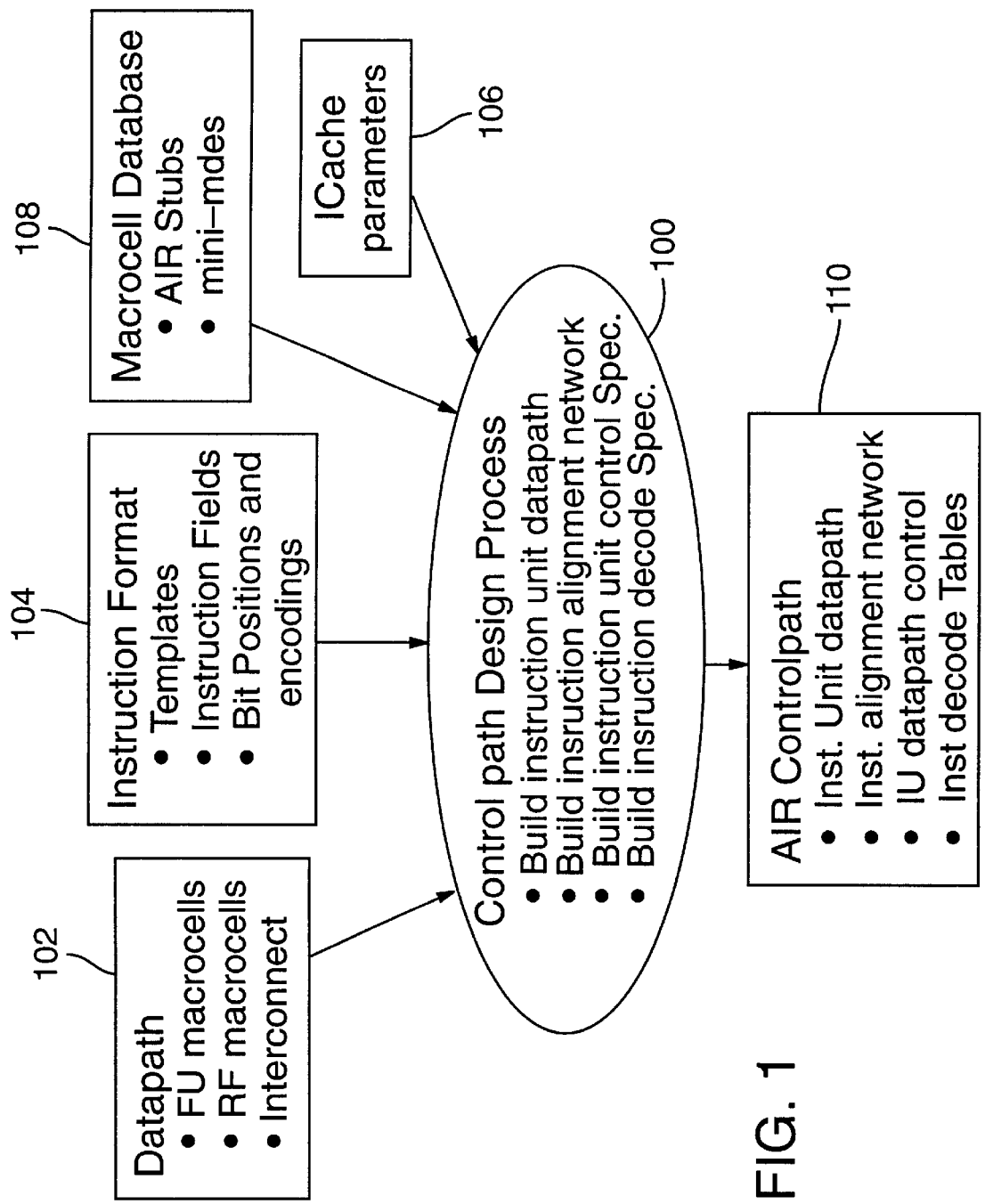
FIG. 1 illustrates a control path design system.

Before describing an implementation of the invention, we begin with a number of definitions used throughout the description.

Definitions

Macrocell Library

A macrocell library is a collection of hardware components specified in a hardware description language. It includes components such as gates, multiplexors (MUXes), registers, etc. It also includes higher level components such as ALUs, multipliers, register files, instruction sequencers, etc. Finally, it includes associated information used for synthesizing hardware components, such as a pointer to a synthesizable VHDL/Verilog code corresponding to the component, and information for extracting a machine description (MDES) from the functional unit components.

In the current implementation, the components reside in a macrocell database in the form of Architecture Intermediate Represenation (AIR) stubs. During the design process, various control path design program modules instantiate hardware components from the AIR stubs in the database. The MDES is in the form of a database language called HMDES Version 2 that organizes information into a set of interrelated tables called sections containing rows of records called entries, each of which contain zero or more columns of property values called fields. For more information on this language, see John C. Gyllenhaal, Wen-mei W. Hwu, and B. Ramakrishna Rau. HMDES version 2.0 specification. Technical Report IMPACT-96-3, University of Illinois at Urbana-Champaign, 1996.

For information on machine descriptions used to re-target a compiler, and programmatic methods to extract such a description, see the MDES Extractor Application referenced above.

Architecture Intermediate Representation

The Architecture Intermediate Representation (AIR) is a hardware description language in a machine-readable form. The form of AIR used in the automated control path design is similar to VHDL, but is implemented in a computer language that makes hardware components described in AIR format easier to manipulate with the program routines.

AIR provides a number of $C^{++}$ classes that represent hardware components such as registers, ports and wiring. An AIR design consists of objects instantiated from these classes. For example, an AIR representation of the control path may include a number of macrocell objects representing hardware components such as a register, a FIFO buffer, multiplexor, a tri-state buffer, and wiring. Each of the macrocells may have a number of control and data ports in AIR format and may be interconnected via an AIR wiring data structure.

Data path specification

The data path specification is a data structure specifying functional units, register files and interconnections between the data ports of the functional units and register files. The data path also specifies control ports, such as the opcode inputs of the functional units and the register file address inputs. However, the task of connecting these control ports to the decode logic in the control path is left to the control path design process.

In the implementation, the data path specification is a set of related classes in AIR format, enumerating the macrocell instances of functional units and their interconnect components, such as multiplexors, tri-state buffers, buses, etc.

For more information on the datapath specification and programmatic methods for designing a processor datapath, see the Datapath Application referenced above.

Concrete Instruction Set Architecture Specification

The concrete ISA specification includes the instruction format specification, and a register file specification.

Register File Specification

A register file specification of a processor includes a list of the processor's register files specifying their types and the number of registers in each file. It also includes a correspondence between each operand instruction field type and a register file.

The register file specification may be taken from the data path specification, or in some applications, it may be taken from a concrete ISA specification, which is provided as input to the control path design process.

Instruction format specification

The instruction format (IF) specification is a data structure specifying the instruction fields of the instructions executed in the processor, including the opcode, source operand(s) and destination operand(s). In some processor designs, the IF specification may include additional bit specifiers that control the data path, such as multiplexor selector bits, and an instruction identifier (e.g., a field that identifies the instruction template).

In addition to enumerating these fields, the IF specification assigns bit positions and encodings to each of them. The bit positions are specific positions that each field occupies in an instruction. For example, each instruction is typically comprised of several fields that each occupies a contiguous or non-contiguous group of one or more bit positions.

The control path design defines how the control path will issue the instruction to the decode logic in the processor. The decode logic needs to reference the start of the instruction so that it can properly interpret the encoded fields within it. For instance, the control path design may require that the instruction be left aligned in an instruction register that interfaces with the decode logic. With knowledge of how the decode logic will reference each instruction and the bit positions and encodings of each of the fields, the control path design process can generate the decode logic for decoding the instruction and dispatching control signals to the control ports of the data path.

For more information on instruction formats and programmatic methods for designing instruction formats, see the Instruction Format Application referenced above.

Instruction unit

The instruction unit includes a control path and an instruction sequencer. The control path has three principal components: 1) the data path of an instruction from the instruction cache to instruction decode logic (the IUdatapath), 2) the control logic for controlling the IUdatapath, and 3) the instruction decode logic for decoding each instruction.

In the current implementation, the IUdatapath starts at the instruction cache and ends at an instruction register that interfaces with the instruction decode logic. It includes instruction prefetch buffers and an instruction alignment network for aligning the instruction in the instruction register. Connected between the sequencer and IUdatapath, the IU control logic is combinational logic used to control the instruction prefetch buffers, and the alignment network.

The control logic also provides information to the instruction sequencer that is used to initiate the fetching of the next instruction packet from the I-cache. For example in the current implementation, the control logic processes information from the instruction that specifies the width of the current instruction and indicates whether the next instruction is aligned to a known address boundary (e.g., an instruction packet boundary). The width of the current instruction is derived from an instruction identifier called the template ID. The packet boundary information is specified in the instruction as a consume-to-end-of-packet bit indicating whether the next instruction directly follows the current instruction or starts at the next packet boundary. This bit is used to align certain instructions (e.g., branch targets) to known address boundaries. The instruction may also include spare bits that encode the number of no-op cycles to follow the current instruction.

Instruction sequencer

The instruction sequencer is the control logic that interfaces with the control logic of the IUdatapath and specifies the sequence of instructions to be fetched from the instruction cache. It manages a memory address register (MAR) that holds the memory address of the next instruction to be fetched from the instruction cache, and the Program Counter, identifying the next instruction to be executed in the processor. The control ports of the sequencer interface with the control ports of the IUdatapath control logic. The sequencer is also responsible for interfacing with the branch functional unit and managing events such as interrupts and exceptions.

Control path protocol

The control path protocol provides a structural and procedural model of the control path. The structural model identifies the types of macrocells used to construct the control path, as well as the parameters of these components. Examples of these components may include a prefetch buffer that covers the latency of sequential instruction fetch, an instruction register for storing the next instruction to be issued to the decode logic, and an alignment network made of multiplexors for aligning the next instruction to be issued in the processor.

The procedural model generally specifies the method for fetching instructions from an instruction cache and issuing them to the control ports in the data path.

The automated control path design system described below is programmed to design a specific instance of a control path based on a predefined control path protocol. The design process includes assigning specific values to the control path parameters in the structural model, and converting the procedural model into a specification of the control logic for controlling instruction fetching.

Programmatic

The term "programmatic" means performed by a program implemented in either software or hardware. The control path synthesizer described below is implemented in a program stored on a computer readable medium. A computer readable medium is a generic term for memory devices commonly used to store program instructions and data in a computer.

A computer executes the control path synthesizer program from the computer readable medium. The program's input includes computer readable data structures representing an instruction format and data path and the output is a description of the processor's control path.

Overview of Control Path Design System

The control path design system is a programmatic system that extracts values for control path parameters from an instruction format and data path specification and creates a control path specification in a hardware description language, such as AIR.

FIG. 1 is a block diagram illustrating a general overview of the control path design system. The inputs to the control path design synthesizer (CP synthesizer) 100 include a data path specification 102, an instruction format specification 104, and ICache parameters 106. The CP synthesizer selects the hardware components for the control path design from a macrocell database 108 that includes generic macrocells for a sequencer, registers, multiplexors, wiring buses, etc. in AIR format. The macrocell database also includes a machine description of certain macrocells, referred to as mini MDES. The mini-MDES of a functional unit macrocell, for example, includes the functional unit opcode repertoire (i.e., the opcodes executable by the functional unit and their binary encoding), a latency specification, internal resource usage, and input/output port usage.

Implemented as a set of program routines, the CP synthesizer extracts parameters from the data path, the instruction format, and instruction cache specifications and synthesizes the control path including the IUdatapath, control logic for controlling the IUdatapath, and decode logic for decoding the instructions in the instruction register.

The CP synthesizer builds the IUdatapath based on the instruction width requirements extracted from the instruction format specification. It instantiates macrocells in the IUdatapath by computing their parameters from the maximum and minimum instruction sizes and the instruction cache access time.

It then constructs the control logic for controlling the IUdatapath based on the computed IUdatapath parameters and the ICache parameters. The ICache parameters provide basic information about the instruction cache needed to construct the instruction fetch logic. These parameters include the cache access time and the width of the instruction packet, which is the unit of cache access.

The control path design process synthesizes the decode logic for decoding the instruction in the instruction register by scanning the instruction format and data path control ports. It also determines the interconnect between the bit positions in the instruction register and the control ports in the data path.

The CP synthesizer is programmed to optimize the design of the instruction unit for a pre-determined control path protocol. As part of this process, it may optimize the instruction pipeline (the IUdatapath) by selecting macrocells that achieve a desired instruction issue rate, such as one instruction to the decode logic per cycle, and by minimizing the area occupied by the macrocells. It may also minimize the area of the control logic, such as the area that the IU control logic and decode logic occupies.

The output of the control path design process is a data structure that specifies the control path hardware design in the AIR format 110. The AIR representation of the IUdatapath includes the macrocells for each of the components in the IUdatapth. This may include, for example, a prefetch buffer for covering the latency of sequential instruction fetching, and other registers used to store instructions before issuing them to the decode logic. The AIR representation includes a macrocell representing the sequencer and the control logic specification (e.g., a synthesizable behavioral description, control logic tables, etc.) representing the control logic for each of the components in the IUdatapath. Finally, the AIR representation includes a decode logic specification (e.g., decode logic tables) representing the instruction decode logic and the interconnection of this decode logic between the instruction register and the control ports enumerated in the data path specification. Conventional synthesis tools may be used to generate the physical logic (such as a PLA, ROM or discrete logic gates) from the control and decode logic specifications.

The Relationship between the Control Path and the Control Ports in the Data Path Before describing aspects of the control path in more detail, it is instructive to consider the state of the processor design before the CP synthesizer is executed. As noted above, one input of the control path design process is the data path specification. Provided in the AIR format, the data path input 102 specifies instances of the functional unit macrocells and register file macrocells in the data path. It also specifies instances of the macrocells representing the wiring that interconnects the read/write data ports of the register files with input and output data ports of the functional units. At this phase in the design of the processor, the control ports in the data path are enumerated, but are not connected to other components. For example, the opcode input of the functional units and the address inputs of the register files are enumerated, but are not connected to the control path hardware.

Figure 2:
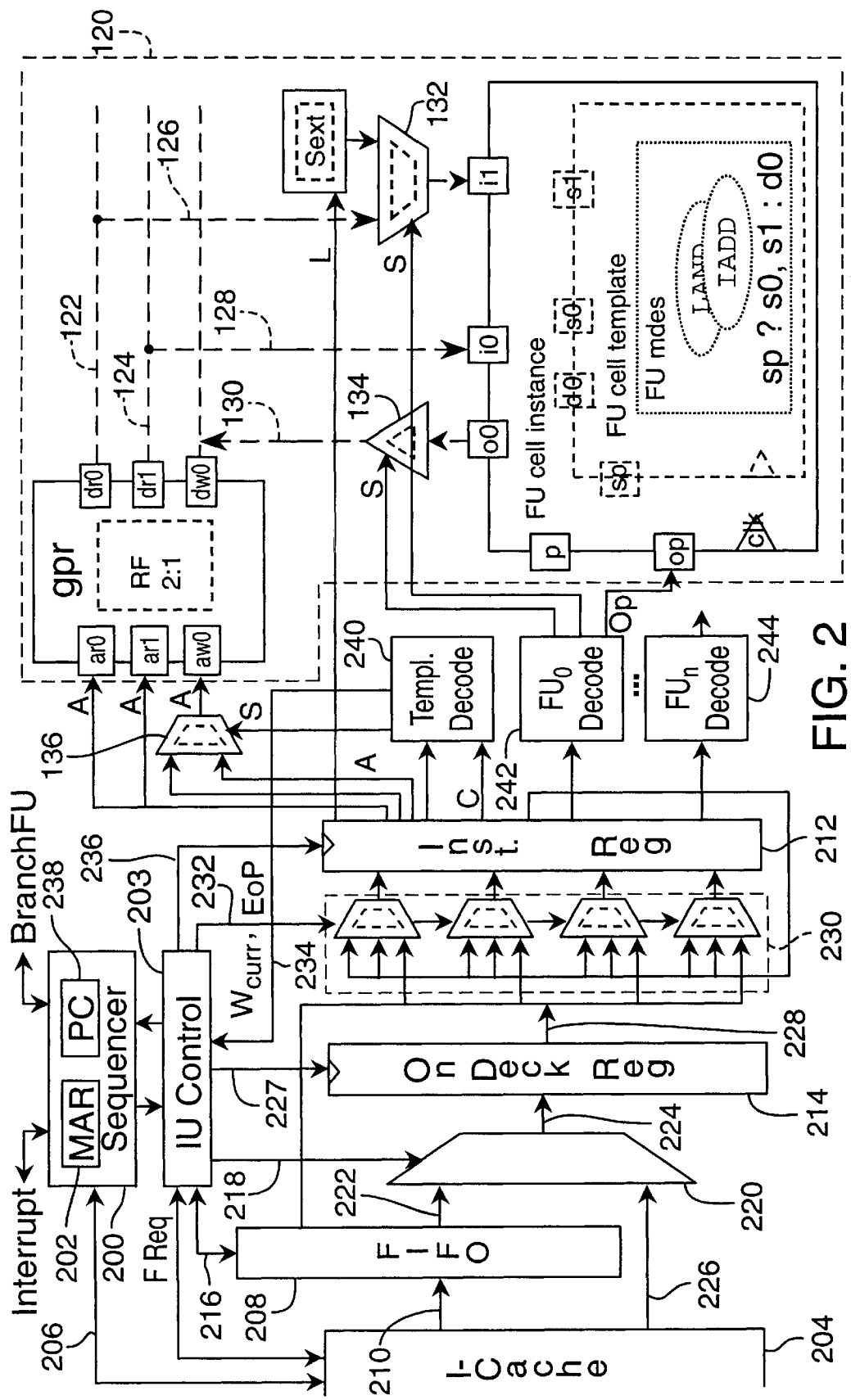
FIG. 2 illustrates an example of a processor control path and data path.

FIG. 2 illustrates an example of a processor design, showing the relationship between the data path (in dashed box 120) and the control path. The data path includes a register file instance, gpr, a functional unit (FU) cell instance, and an interconnect between the gpr and functional unit. The interconnect comprises data buses 122–130 that carry data between the FU and gpr, a multiplexor 132 that selects between input sources (e.g., gpr and literal pseudo-register Sext), and tri-state buffer 134 that drives output data from the FU onto a data bus 130. The data read ports of the gpr, dr0 and dr1, provide data to the data input ports of the FU, i0 and i1, via buses 122–128 and multiplexor 132. The output port of the FU, o0, provides data to the data write port, dw0, via tri-state buffer 134 and data bus 130.

The control ports that are enumerated, yet remain unconnected before the control path design, include the read and write address ports of the gpr, ar0, ar1 and aw0, and the opcode input port, op, of the FU. Some data ports in a FU or gpr may map to more than one data port in the gpr or FU, respectively. This sharing may be controlled via control ports of a multiplexor 132 or tri-state buffer 134.

Also, a control port of the gpr or FU may map to more than one bit position in the instruction. This type of sharing may be controlled via control ports of a multiplexor 136, for example. However, the hardware logic to control this sharing is left to be specified in the control path design process.

The mapping between the instruction fields in an instruction and the control ports in the data path is specified in the instruction format specification. The datapath specification enumerates the control ports in the data path and provides the information needed to map these control ports to the instruction fields. The instruction format specification specifies the specific bit positions and encodings of the fields in the instruction fields.

The following sections describe in more detail how an implementation of the control path design process generates the control path.

The Control Path Protocol

The control path design process synthesizes a specific control path design based on a predefined control path protocol. In the current implementation, the control path protocol defines a method for fetching instructions from an instruction cache and dispatching them sequentially to an instruction register that interfaces with the processor's decode logic. It also defines the type of macrocells that the control path will be constructed from and enumerates their parameters. The CP synthesizer program then selects the macrocells and computes specific values for their parameters based on information extracted from the instruction format and datapath.

The example in FIG. 2 helps to illustrate the control path protocol used in the current implementation. It is important to note that a number of design choices are made in defining the protocol, and these design choices will vary with the implementation. The illustrated protocol represents only one possible example.

To get a general understanding of the control path protocol, consider the flow of an instruction through the control path in FIG. 2. The sequencer 200 initiates the fetching of instructions into the IUdatapath. The MAR 202 in the sequencer stores the address of the next instruction to be fetched from the instruction cache 204. Using the contents of the MAR, the sequencer initiates the fetching of instructions from the cache for both a sequential mode and a branch mode.

In order to specify values for the widths of components in the IUdatapath, the CP synthesizer extracts information about the instruction widths from the instruction format specification. The protocol specifies the types of parameters that need to be extracted from this information.

The parameters extracted from the instruction format include:

$Q_I$ // quantum (bytes) (greatest common denominator of all possible instruction widths, fetch widths)

$W_{imin}$ // minimum instruction width (quanta)

$W_{imax}$ // maximum instruction width (quanta)

The parameter, $Q_I$, is a unit of data used to express the size of instruction and fetch widths in an integer multiple of bytes and is referred to as a quantum. This parameter is not critical to the invention, but it does tend to simplify the design of other components such as the alignment network because it is easier to control shifting in units of quanta rather than individual bits. The parameters to be extracted also include, $W_{imin}$, the minimum instruction width in quanta, and $W_{imax}$, the maximum instruction width in quanta.

The protocol also defines parameters relating to the instruction cache (ICache) as follows:

$W_A$ // instruction packet width (quanta) ($W_A \geq W_{imax}$, $W_A = 2^m$)

$W_L$ // cache line size (quanta) ($W_L \geq W_A$, $W_L = 2^n$)

$T_A$ // cache access time (cycles)

The instruction packet defines the amount of data that the control path fetches from the ICache with each fetch operation. In the protocol of the current implementation, the size of the instruction packet is defined to be at least as large as the widest instruction and is expressed as a number of quanta that must be a power of two. However, the packet need not be that large if the widest instruction is infrequent. In instruction format designs where the widest instruction is infrequent, the size of the control path can be reduced because the extra cycles needed to fetch instructions larger than the packet size will rarely be incurred. The computation of the packet size can be optimized by finding the smallest packet size that will provide a desired fetch performance for a particular application or a set of application programs.

The protocol specifies the method for fetching instructions from the ICache and the types of components in the IUdatapath. In the current implementation, the protocol includes a prefetch packet buffer, an On Deck Register (OnDeckReg or ODR) and an instruction register (IR). As shown in FIG. 2, the sequencer 200 is connected to the instruction cache 204 via control lines 206. These control lines include ICache address lines used to specify the next instruction to be fetched into the IUdatapath. Through these control lines, the sequencer 200 selects the packet and initiates the transfer of each packet of instructions from the instruction cache to a First-In, First-Out (FIFO) buffer 208.

The cache access time $T_A$ is an ICache parameter provided as input to the control path design process. It is the time taken in cycles between the point when an address is presented to the address port of the ICache and when the corresponding data is available on its data port for reading. The cache line size parameter defines the width of a cache line in quanta. The control path design process selects a cache line size that is greater or equal to the packet size and is expressed as a number of quanta that must be a power of two. Although not necessary, this implies that in our current implementation a cache line contains an integral number of instruction packets.

The IUdatapath begins at the ICache and flows into the FIFO 208 via data lines 210. The number of data lines is defined as the instruction packet size in quanta. The FIFO 208 temporarily stores packets of instructions on their way to the instruction register 212. The objective in designing the FIFO is to make it deep enough to cover the latency of sequential instruction fetching from the instruction cache. The control path must be able to issue instructions to the instruction register to satisfy a desired performance criterion. In this case, the protocol defines the performance criterion as a rate of one instruction issue per clock cycle of the processor. Note, one instruction may contain several operations that are issued concurrently.

The IU Control 203 is responsible for controlling the flow of instruction packets from the FIFO 208 to a register that holds the next packet of instructions to be issued to the instruction register, called the ODR 214. In the example shown in FIG. 2, the IU Control 203 controls the flow of instruction packets from the FIFO to the ODR 214 through control lines 216 to the FIFO 208, and control lines 218 to a multiplexor 220. The control lines 21 6 from the IU Control to the FIFO are used to accept new instruction packets from the ICache and to instruct the FIFO to transfer the next instruction packet to the ODR via data lines 222 from the FIFO to the multiplexor 220 and data lines 224 from the multiplexor to the ODR. As explained above, the size of this data path is defined via the instruction packet size parameter.

The IU Control 203 issues control signals 218 to the multiplexor 220 to select an instruction packet either from the FIFO 208 or directly from the instruction cache 204. The data path 226 is useful in cases where the FIFO has been cleared, such as when the processor has executed a branch instruction and needs to load the instruction packet containing the target of the branch into the ODR as quickly as possible.

The size of the FIFO (in packets) is another parameter in the control path protocol. The size of the FIFO depends upon the maximum and minimum instruction widths of instructions in the instruction format as well as the ICache access time. The width of an instruction may be as large as the maximum instruction width, and may be as small as the minimum instruction width in the instruction format specification. This constraint is merely a design choice in the current implementation, and is not necessary. The minimum instruction width plays an important role in determining the size of the FIFO because, in an extreme case, the ODR may be filled entirely with instructions of minimum size. In this case, the FIFO needs to be large enough to be filled with instruction packets already in flight from the ICaches as each of the instructions is issued sequentially from the ODR. The maximum instruction width also has an impact on the size of the FIFO because, in the opposite extreme, the ODR may contain a single instruction. In this case, the FIFO must be able to supply an instruction packet to the ODR at the desired performance rate, namely, once per clock cycle, while hiding the ICache access latency.

The parameters associated with the instruction fetch process include the size of the FIFO and the branch latency. These parameters are computed as shown below. The necessary FIFO size can be computed based on IUdatapath parameters and the instruction fetch policy. In case the policy does not allow for stalling the processor due to interrupts, then the FIFO size can be reduced further.

$N_{FIFO}$ // size of prefetch FIFO (packets) ($N_{FIFO} = \lceil T_A * W_{imax}/W_A \rceil$)

$T_B$ // branch latency ($T_B = T_{dpath} + T_A + 1$)

The IU Control 203 controls the transfer of each instruction from the ODR 214 to the instruction register 212. The IU Control provides control signals via control lines 227 to the ODR, which in turn transfers the next instruction to the instruction register 212 via data lines 228 and an alignment network 230. The alignment network is responsible for ensuring that each instruction is left aligned in the instruction register 212. In the example shown in FIG. 2, the alignment network is comprised of a multiplexor for each quantum in the instruction register. Each of these multiplexors indicates where the next quantum of data will originate from in the ODR 214 or the IR 212. The IU Control 203 provides multiplexor select controls via control lines 232 based on parameters fed back from the decode logic via control lines 234.

Figure 3:
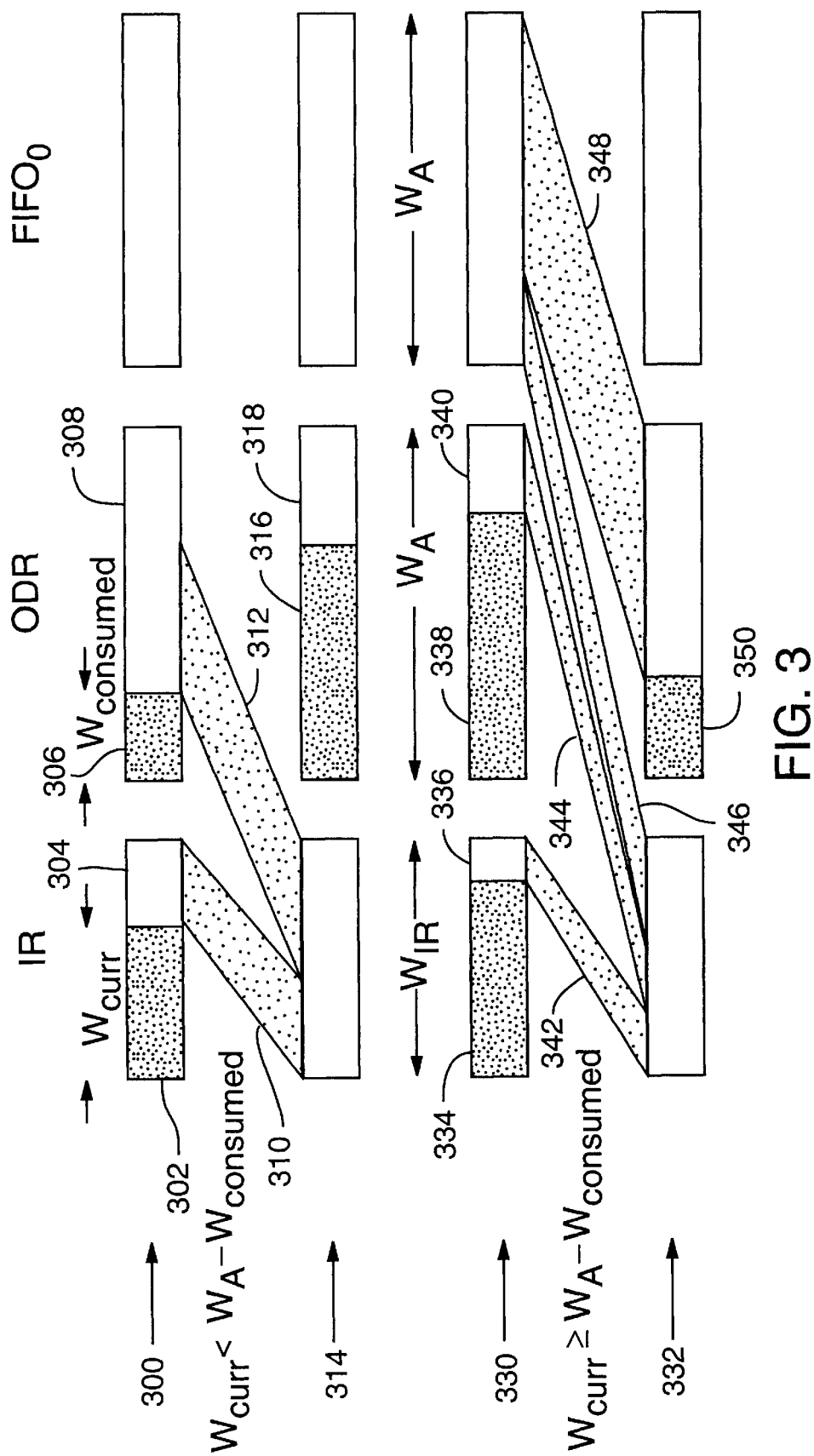
FIG. 3 illustrates the operation of a shift network for the control path design of FIG. 2 for sequential instruction fetching.
Figure 4:
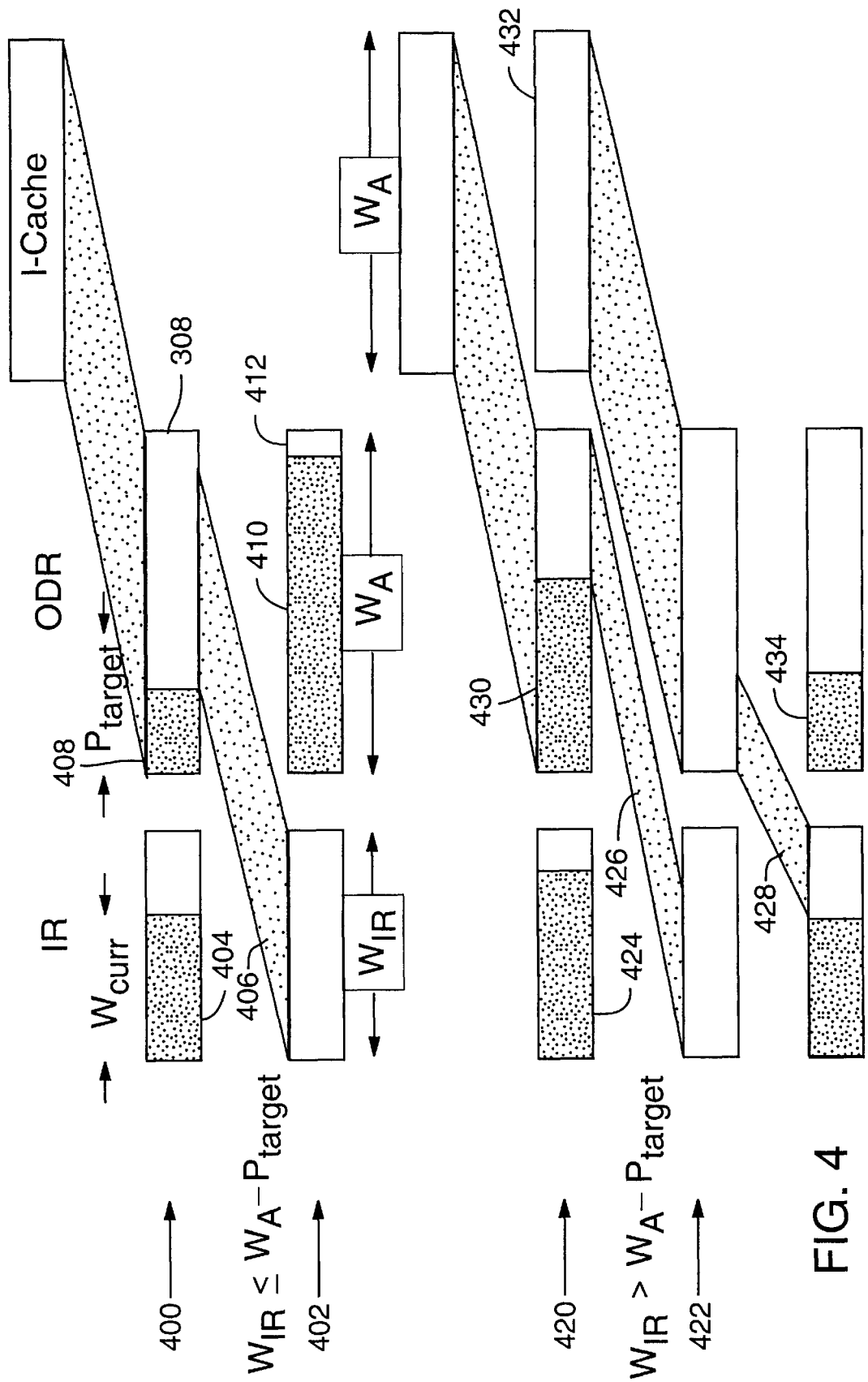
FIG. 4 illustrates the operation of the shift network for branch target instruction fetching.

The control path protocol outlines the operation of the alignment network. There are two principle modes of operation that the protocol of the alignment network must address: sequential instruction fetch mode; and branch target instruction fetch mode. FIG. 3 illustrates the operation of the shift network protocol for sequential instruction fetching, and FIG. 4 illustrates the operation of the shift network for branch target instruction fetching. Before describing the operation of the shift network in more detail, we begin by describing the relevant parameters associated with the shift network. The parameters in the current implementation are as follows:

$W_{IR}$ // width of instruction register (quanta) ($W_{IR} = W_{imax}$)

$W_{curr}$ // width of current instruction (quanta)

$W_{consumed}$ // width of already used part in ODR (quanta)

$P_{target}$ // position of branch target in ODR (quanta)

As noted previously, the shift network controls where each bit of data in the instruction register comes from. This data may come from the IR, the ODR, or in some cases, from both the ODR and the top instruction packet in the FIFO. With each cycle, the shift network ensures that the next instruction to be executed is left aligned in the instruction register. In doing so, it may shift unused bits within the instruction register itself, it may transfer bits from the ODR, and finally it may also transfer bits from the top of the FIFO. In particular, if the instruction register contains unused bits from the previous cycle representing part of the next instruction, it shifts these unused bits over to the left, and then fills in the rest of the instruction register with the next group of bits sufficient to fully load the register.

As noted above, the FIFO transfers instructions to the OnDeck register in packets. A packet remains in the ODR, and is incrementally consumed as the alignment network transfers portions of the bits in the ODR into the instruction register. The IU Control supplies control signals via control lines 236 to the instruction register 212 to issue the current instruction to the decode logic. The PC 238 in the sequencer specifies the memory address of the instruction currently being issued for execution.

The Alignment Network Protocol

FIG. 3 illustrates the two principle cases that occur in the shift network protocol for sequential instruction fetching. The first case is where the width of the current instruction in the instruction register, $W_{curr}$, is less than the remaining, unconsumed portion of the ODR, $W_A - W_{consumed}$. FIG. 3 illustrates an example of this scenario by showing the transition of the state of the instruction register, ODR, and FIFO from one cycle to the next. In the first cycle 300, the current instruction occupies the left-most section (see section 302) of the instruction register, while a part of the next instruction occupies the remaining section 304. Also, a portion 306 of the ODR is already consumed, and the remaining section 308 contains valid data. In this case, the shift network shifts the unused portion 304 to the left of the instruction register (see section 310 representing the transfer of the bits from the right of the instruction register to the left-most position). In addition, the shift network transfers enough bits to fill in the remainder of the instruction register (see section 312) from the left-most valid data portion 308 in the ODR.

In the next cycle 314, the instruction register contains the current instruction, aligned to the left, and a portion of the next instruction. The length of the current instruction becomes known only after decoding. The ODR contains a consumed portion 316, which includes portions that the shift network already transferred in previous cycles. It also contains a remaining valid data portion 318. The FIFO remains unchanged in this case.

The bottom diagrams 330, 332 in FIG. 3 illustrate the case where the width of the current instruction is greater than the valid data portion ($W_A - W_{consumed}$). In this case, the current instruction occupies a relatively large section 334 of the instruction register and the remaining portion 336 contains part of the next instruction. The consumed portion 338 of the ODR is relatively large compared to the remaining valid data portion 340. As a result, the shift register needs to transfer data from three sources: the unused portion 336 of the instruction register (shown being transferred in graphic 342), the entire valid data portion remaining in the ODR 340 (shown being transferred in graphic 344), and finally, a portion in the top packet of the FIFO that is needed to fill in the rest of the instruction register (shown being transferred in graphic 346). Since the ODR is fully consumed, the top packet of the FIFO needs to be advanced to the ODR. However, this example shows that a portion of the packet in the top of the FIFO is already consumed when the packet is transferred into the ODR (see section 348 being transferred into the ODR), which leaves a consumed portion 350 in the OnDeck register.

FIG. 4 illustrates the two principle cases that occur in the shift network protocol for branch target instruction fetching. When the processor executes a branch instruction, the control path should load the instruction containing the target of the branch as quickly as possible. There are a variety of schemes to accomplish this objective. Even within the specific protocol described and illustrated thus far, there are alternative ways to define the target fetch operation. In the example shown in FIG. 4, the target of a branch is allowed to reside anywhere in an instruction packet. This may result in the case where the next portion of valid data to be loaded into the instruction register (the target data) spans two instruction packets. One way to avoid this case is to require the application program compiler to align branch targets at the beginning of instruction packets. However, the example shown in FIG. 4 is more general and handles the case where the target data spans instruction packets.

The top diagrams 400, 402 illustrate the case where the target data is entirely within an instruction packet. This case is defined as a packet where the width of the instruction register, $W_{IR}$, is less than or equal to the width of a packet, $W_A$, less the position of the target instruction relative to the start of the packet, $P_{target}$. In the first cycle 400, the current instruction occupies the left-most portion 404 of the instruction register. In the shift operation, the entire contents of the instruction register are considered invalid. As such, the shift network fills the instruction register with new bits sufficient to fill it entirely (as shown in graphic 406. The starting bit in the ODR for this shift operation is identified by $P_{target}$ (see invalid portion 408 in the ODR, which has a width $P_{target}$). Since the width of the instruction register plus $P_{target}$ is still less than or equal to $W_A$, all of the new data comes from the ODR. After the shift, the consumed portion of the ODR occupies the left-most portion 410 and some valid data for the next instruction may reside in the remaining portion 412.

The bottom two diagrams 420, 422 show the case where the target data spans an instruction packet. This case is defined as a packet where the width of the instruction register, $W_{IR}$, is greater than the width of a packet, $W_A$, less the width of the offset to the target instruction inside the packet, $P_{target}$. In the first diagram 420, the current instruction occupies the left-most portion 424 of the instruction register. In the shift operation, the entire contents of the instruction register are considered invalid. As such, the shift network fills the instruction register with new bits sufficient to fill it entirely, but to do so, it must take bits from the ODR and the next packet from the ICache (as shown in graphics 426 and 428). The starting bit in the ODR for this shift operation is identified by $P_{target}$ (see invalid portion 430 in the ODR, which has a width $P_{target}$). Since the width of the instruction register plus $P_{target}$ is greater than $W_A$, some of the new data comes from the ODR and some comes from the next packet from the ICache. To get the target data into the instruction register, the control path may require two cycles. The shift network transfers valid bits from the ODR (as identified by $P_{target}$) to the IR and transfers the next packet (432) from the ICache into the ODR. It then transfers valid bits from the ODR (428) sufficient to fill the IR. This leaves a portion of the bits in the ODR 434 ($W_{IR} - (W_A - P_{target})$) invalid.

The shift network protocol outlined above specifies how the IU Control logic controls the select ports of the multiplexors in the shift network in order to make the selection of the appropriate quanta in the IR, ODR, and FIFO. Further details about the synthesis of the shift network are provided below.

The final aspect of the control path protocol is the decode logic. Referring again to the example in FIG. 2, the decode logic (e.g., decode units 240–244) interfaces with the instruction register, decodes the current instruction, and dispatches control signals to the control ports in the data path. The CP synthesizer computes decode tables from the instruction format design as explained below.

Control Path Design

Figure 5:
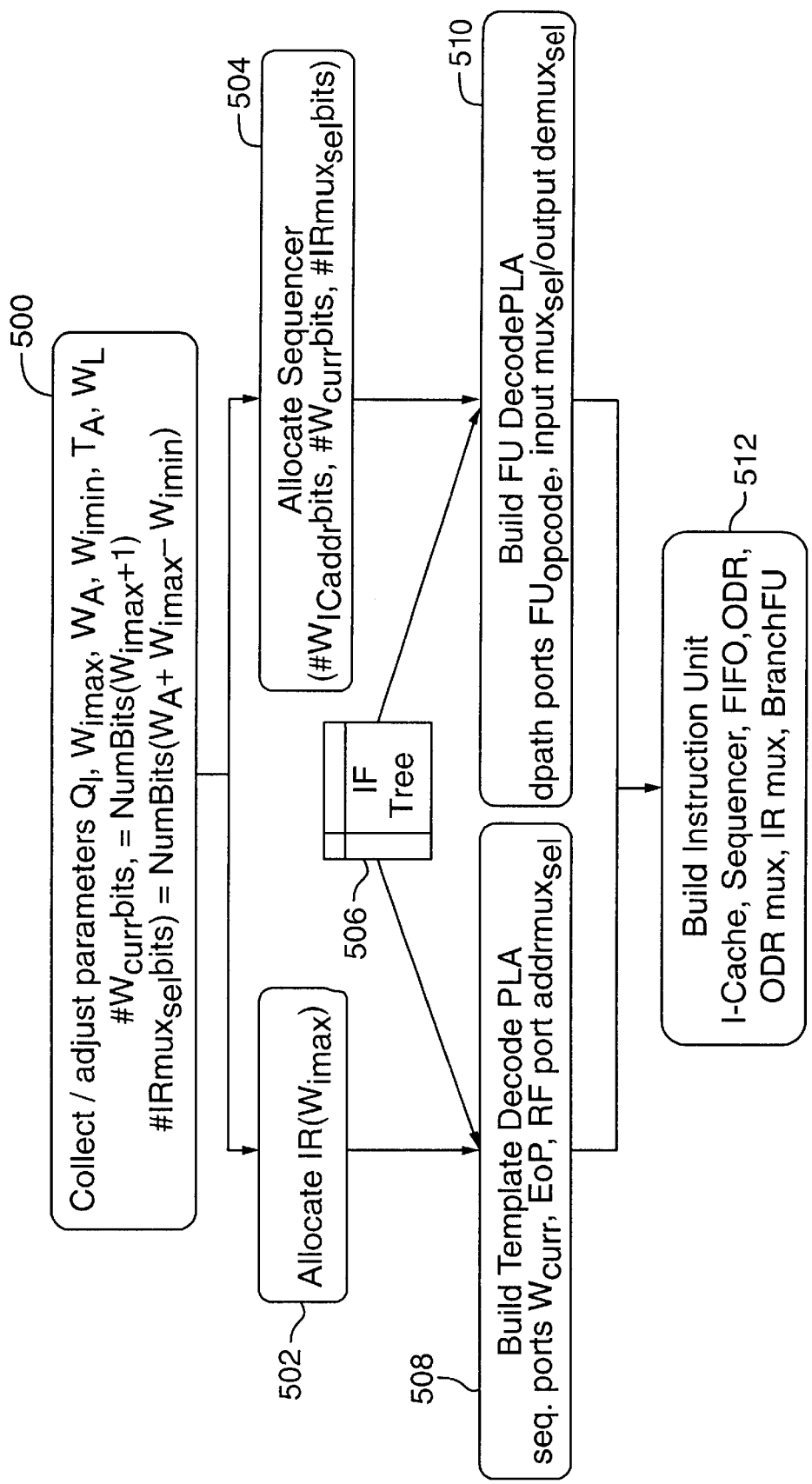
FIG. 5 is a flow diagram illustrating the operation of a software implemented control path design system.

FIG. 5 is a flow diagram illustrating the operation of a software implementation of the CP synthesizer illustrated in FIG. 1. The CP synthesizer is implemented in the C++ programming language. While the software may be ported to a variety of computer architectures, the current implementation executes on a PA-RISC workstation or server running under the HP-UX 10.20 operating system. The functions of the CP synthesizer software illustrated in FIG. 5 are described in more detail below.

Collecting Parameter Values

The CP synthesizer begins by collecting and adjusting input parameters, $Q_I$, $W_{imax}$, $W_{imin}$, $W_A$, $T_A$, and $W_L$ as shown in step 500. It calculates $Q_I$ as the greatest common denominator of all possible instruction widths and fetch widths. It extracts $W_{imax}$, $W_{imin}$ from the instruction format, and derives $W_A$ and possibly adjusts $W_L$ as defined above. The ICache access time $T_A$ is one of the ICache input parameters to the control path design.

The CP synthesizer computes #$W_{curr}$bits, a parameter that defines the number of bits needed to represent the length of the current instruction in quanta. The length of the current instruction may be zero or as large as $W_{imax}$. Therefore, $W_{curr}$bits is computed as $\lceil \log_2(W_{imax}+1) \rceil$. The IU Control receives $W_{curr}$ from the decode logic (See lines 234 in FIG. 2) and uses it to compute the appropriate shift amount for the shift and align network. The sequencer also uses this number to update the PC with the address of the next instruction to execute. The CP synthesizer determines the number of instruction register multiplexor selection bits #IRmux$_{sel}$bits as shown in step 500, from the following expression: #IRmux$_{sel}$bits=$\lceil \log_2(W_A+W_{imax}-W_{imin}) \rceil$ in bits. This is the number of bits needed to select between ($W_A+W_{imax}-W_{imin}$) input quanta choices for each quantum multiplexor placed before the instruction register.

Allocating the Instruction Register and Sequencer

Next, the CP synthesizer selects an instruction register from the macrocell database as shown in step 502, and sets the width of the instruction register equal to $W_{imax}$.

The CP synthesizer also selects a sequencer from the macrocell database in step 504. The sequencer includes logic to process the branch addressing, logic to handle interrupts and exceptions and logic to issue instruction fetching from the ICache. The choice of the sequencer depends on the architectural requirements specified during the design of the datapath and the instruction format, i.e., whether the processor needs to handle interrupts and exceptions, branch prediction, and control and data speculation. It is independent of the design of the instruction unit data path itself. Therefore, we assume that we have a set of predesigned sequencer macrocells available in the macrocell database from which one is selected that matches the architectural parameters of the datapath and the instruction format.

Building the Instruction Decode Logic

The CP synthesizer generates decode logic from the instruction format specification, which is provided in the form of a syntax tree structure called the IF tree 506. Before describing the decode logic synthesis, we provide an overview of the IF tree with the example tree structure shown in FIG. 6. The IF tree is a syntax tree structure for an instruction that represents each instruction as a template. Each template has a concatenation of instruction fields, including the fields for each operation in the instruction, e.g., source and destination operands and an opcode. The instruction format specifies the bit positions of each of these fields as well as the bit encodings. Each instruction field, either directly or indirectly via decoding, controls some control port in the data path.

From this information about instruction fields and their bit positions and corresponding control ports, the control path design process automatically creates decode tables that define the decode logic.

Figure 6:
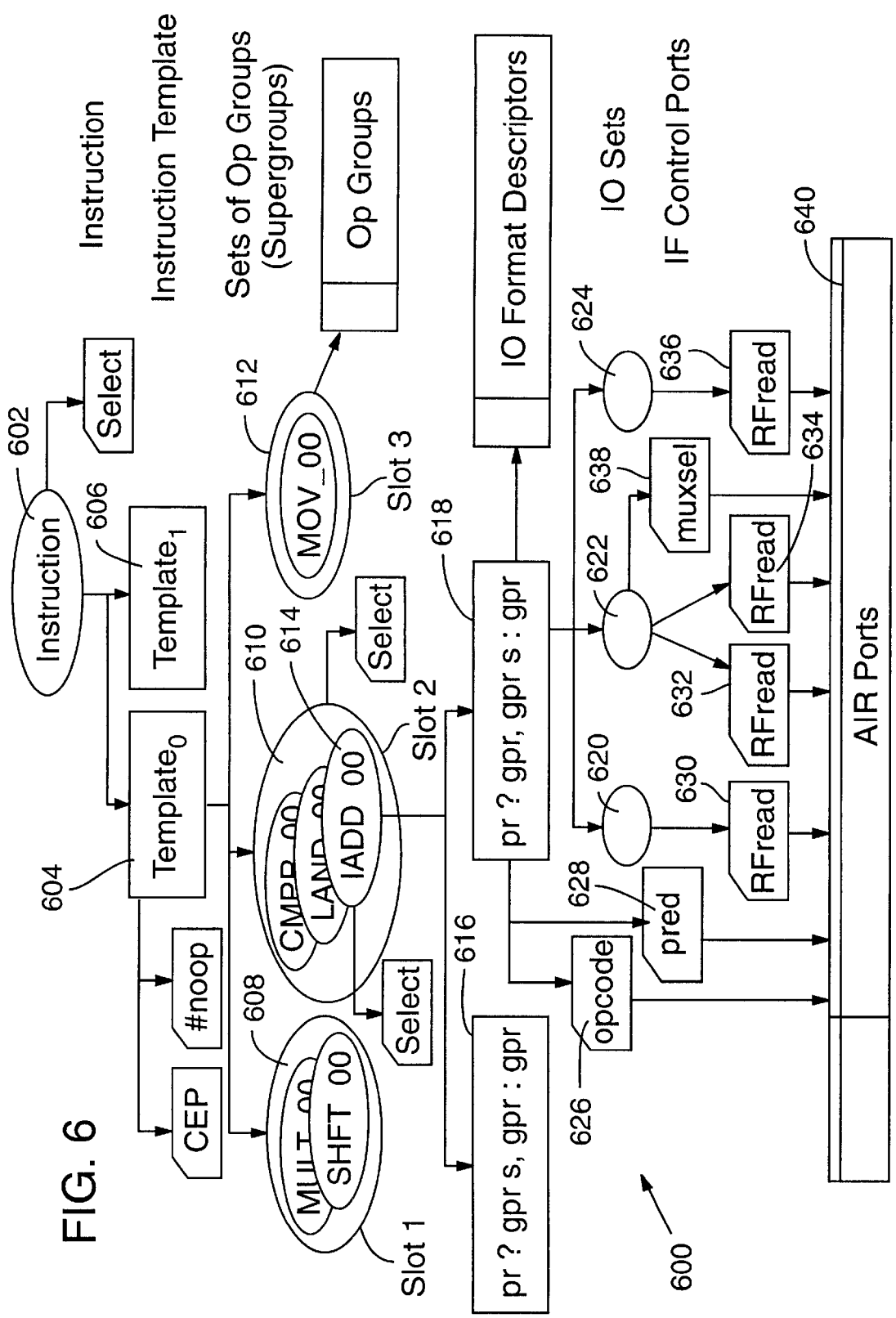
FIG. 6 is a diagram of a syntax tree data structure representing an instruction format specification.

FIG. 6 illustrates the structure of an if-tree 600 used in the current implementation. The overall structure of the tree defines how each instruction is built. Each part of the tree represents a node, with the lowest nodes (the cut-off-box-shaped nodes) forming the tree's leaves. The oval-shaped nodes are "OR" nodes, while the boxed-shaped nodes are "AND" nodes. The OR nodes denote a selection between the children of the node such that only one choice (one branch) is used within an instruction. Conversely, an AND node requires all of the components of the node to be present in an instruction. Stated another way, each level of the tree is either a conjunction (AND) or disjunction (OR) of the subtrees at the lower level.

The root node 602 of the tree is the overall machine instruction. This is an OR node representing a choice of instruction templates. A template select field (template ID) is used to identify the particular template.

Individual instructions are based on instruction templates, which are the AND-type child nodes of the root node (See, e.g., templates 604 and 606). The templates each encode the sets of operations that issue concurrently. Since the number of combinations of operations that may issue concurrently is astronomical, it is necessary to impose some structure on the encoding within each template. Hence, each template is partitioned into one or more operation issue slots. Every combination of operations assigned to these slots may be issued concurrently.

In addition, each template has a consume to end-of-packet bit field (CEP) that indicates whether the next instruction directly follows the current instruction or it starts at the next packet boundary. This capability is used to align certain instructions (e.g. branch targets) to known address boundaries. Each template also specifies the number of spare bits that may be used to encode the number of no-op cycle to follow the current instruction. These spare bits may arise due to a need for packet alignment or quantized allocation.

The next level of the tree defines each of the concurrent issue slots. Each slot is an OR node called a super group (i.e., nodes 608, 610, 612) supporting a set of operation groups that are all mutually exclusive and have the same concurrency pattern. A select field chooses among the various operation groups within a super group.

Below each super group lie operation groups. Each operation group (e.g., operation group 614) is an OR node that has a select field to choose among the various operation formats supported by operation group. FIG. 2 shows this situation where one operation format allows a literal field on the left port, while the other allows it on the right port.

Each operation format (e.g., IO format descriptors 616, 618) is an AND node consisting of the opcode field 626, the predicate field (if any) 628, and a sequence of source and destination field types (shown as IO sets 620, 622, 624). The traditional three-address operation encoding is defined at this level.

Each IO set is an OR node consisting of a singleton or a set of instruction fields that identify the exact kind and location of the operand. IO sets with multiple choices (e.g., 622) have a select field to identify which instruction field is intended. For example, one of the IO set nodes 622 represents a selection between instruction fields 632, 634, which is controlled via a multiplexor select field 638. The other IO sets each have only one kind of field, and thus, have a single child node representing that field (nodes 630, 636). The instruction fields point to the datapath control ports 640.

The following description gives some concrete examples of the instruction fields depicted in FIG. 2. FIG. 2 is annotated with letters S, A, L, op and C to illustrate examples of the information flowing from these fields in the instruction register to the control ports in the data path.

Select fields (S). At each level of the if-tree that is an OR node, there is a select field that chooses among the various alternatives. The number of alternatives is given by the number of children, n, of the OR node in the if-tree. Assuming a simple binary encoding, the bit requirement of the select field is then $\lceil \log_2(n) \rceil$ bits. However, alternate encodings are also possible.

Different select fields are used to control different aspects of the datapath. The root of the if-tree has a template select field that is decoded in order to determine the template width ($W_{curr}$), which is routed directly to the instruction unit control logic. Therefore, this field must be allocated at a fixed position within the instruction. The select fields at super group and operation group levels determine how to interpret the remaining bits of the template and therefore are routed to the instruction decode logic for the datapath. The select fields at the level of field types are used to control the multiplexors and tristate drivers at the input and output ports of the individual functional units to which that operation group is mapped. These fields select among the various register and literal file alternatives for each source or destination operand.

Register address fields (A). The read/write ports of various register files in the datapath need to be provided with address bits to select the register to be read or written. The number of bits needed for these fields depends on the number of registers in the corresponding register file. These bits are usually routed from the instruction register to the corresponding control port directly without decoding possibly via a multiplexor.

Literal fields (L). Some operation formats specify an immediate literal operand that is encoded within the instruction. The width of these literals is specified externally in the instruction format specification. Dense ranges of integer literals may be represented directly within the literal field, for example, an integer range of −512 to 511 requires a 10-bit literal field in 2's complement representation. On the other hand, a few individual program constants, such as 3.14159, may be encoded in a ROM or a PLA table whose address encoding is then provided in the literal field. In either case, the exact set of literals and their encodings must be specified in the instruction format specification.

Opcode fields (op). The opcode field bits are used to provide the opcodes to the functional unit to which an operation group is assigned. It is possible to use the internal hardware encoding of opcodes in the functional unit directly as the encoding of the opcode field, in which case the width of the opcode field is the same as the width of the opcode port of the corresponding functional unit and the bits are steered directly to it. This mechanism may be used when all the opcodes supported by a functional unit are present in the same operation group or the same super group.

Under some templates, however, the functional unit assigned to a given operation group may have many more opcodes than those present within the operation group. In this case, opcode field bits may be saved by encoding the hardware opcodes in a smaller set of bits determined by the number of opcodes in that operation group and then decoding these bits before supplying them to the functional unit. In this case, the template specifier bits are used to provide the context for the decoding logic.

Miscellaneous control fields (C). Some additional control fields are present at the instruction level that help in proper sequencing of instructions. These consists of the consume to end-of-packet bit (EoP) and the field that encode the number of no-op cycles following the current instruction.

Building Decode Tables

The CP synthesizer generates the decode logic by creating decode tables that specify the inputs and outputs of the decode logic. In building the decode table, the CP synthesizer specifies the input bit positions in the instruction register, the input values for these bit positions, the corresponding control ports, and finally, the output values to be provided at these control ports in response to the input values. There are two general cases: 1) creating decode table entries for select fields (e.g., bits that control multiplexors and tri-state drivers) ; and 2) creating decode table entries for logic that converts opcodes. In the first case, the CP synthesizer generates the address selection logic needed to map bit positions in the instruction register with shared address control ports in the data path. It also generates the appropriate select values based on the select field encoding in the instruction template. In the second case, the CP synthesizer generates the opcode input values needed to select a particular opcode in a functional unit based on the opcode field encoding in the instruction template. Both of these cases are described further below.

The implementation divides the decode logic into two types of components: the template decode logic (synthesized in step 508) and the FU decode logic, one per FU macrocell (synthesized in step 510). The template decode logic is responsible for decoding all the information that is relevant for the entire instruction including the template width, the end-of-packet bit and the position of register file address port bits. The FU decode logic decodes all the information that is relevant for one FU macrocell including its opcode and the select ports of the data multiplexors and tri-state drivers. In step 508, the CP synthesizer constructs a decode table for a template decode programmable logic array (PLA). As shown in the example FIG. 2, the template decode PLA provides information ($W_{curr}$ and EoP parameter values) to the IU Control to drive the instruction shifting network. It converts the template ID into $W_{curr}$ and feeds this information to the IU Control. It also provides the consume to end-of-packet (EoP) bit to the IU Control.

Based on the template ID, the template decoder also generates the mux select inputs in cases where instruction fields from different templates map to the same control ports in the datapath. For example, it computes select values for the mux select ports of register file address port multiplexors (RF port addrmuxsel; see, e.g., multiplexor 136 in FIG. 2).

To illustrate decode logic generation for select fields, consider the example of the RF address port multiplexors. The CP synthesizer builds a decode table for the address port multiplexors by traversing the IF tree to find the template specifier fields. The template specifier in the instruction identifies the template to the decode logic. This is significant because a number of different bit positions may map to the same register file address port depending on the instruction template. The Table 1 shows an example of this scenario.

TABLE 1

| Template | Bit Positions | Mux Inputs | Mux select |
|---|---|---|---|
| T1 | 0–3 | I1 | 00 |
| T2 | 10–13 | I2 | 01 |
| T3 | 1–3, 10 | I3 | 10 |
| T4 | 10–13 | I4 | 11 |

In the example shown above, four different sets of bit positions map to the same register file address ports, depending on the instruction template. The decode logic, therefore, needs to generate the appropriate mux select signal to map the appropriate bit positions in the instruction to the register file address ports depending on the template specifier bits.

For each template, the CP synthesizer traverses the IF tree to the template specifier field and adds the bit encoding to the decode table as an input. It finds the corresponding bit positions from different templates that map to the same register file address ports and assigns them to the input ports of a multiplexor. Finally, it assigns mux select values so that the decode logic instructs the mux to select the appropriate mux inputs depending on the template specifier.

To illustrate decode logic generation for opcode fields, consider an example where the bits used to encode the opcode field in the instruction do not match the number of bits used to encode the opcode on the functional unit macrocell. The CP synthesizer functional unit constructs the FU decode PLA in step 510 in a similar fashion as the template decode PLA. In particular, it builds a decode table that maps instruction register bits to data path control ports of the functional units in the data path. It traverses the IF tree to find the fields for the FU opcode fields. The CP synthesizer finds the instruction register ports that these fields have been assigned, and maps them to the opcode control ports.

The opcode field in the IF tree identifies the desired operations in an operation group and the corresponding functional unit to the decode logic. The opcode in the instruction field may need to be translated into a different form so that it selects the proper operation in the functional unit. Table 2 shows an example of this scenario.

TABLE 2

| Opcode encoding | FU input |
|---|---|
| 00 | 0000 |
| 01 | 1011 |
| 10 | 1100 |
| 11 | 0010 |

In the above example, the instruction selects one of four different operations to be executed on a given functional unit in the data path. The functional unit, however, supports more operations, and thus, uses a four bit input code to select an operation. In this case, the CP synthesizer generates a decode table for decode logic that will select the proper operation based on the opcode encoding in the instruction register. To accomplish this, it traverses the IF tree to find the opcode field, and the corresponding bit encoding, control port assignment, and bit position for this field. The opcode field in the IF tree is annotated with information that maps a bit encoding in the instruction to a particular input encoding for a functional unit in the data path. The CP synthesizer assigns the inputs of the decode logic to the bit positions of the opcode field, and assigns the outputs of the decode logic to the opcode control ports of the functional unit.

The FU decode logic for the control ports of the muxes and tri-states in the interconnect between the functional units and register files are generated based on the select fields at the IO set level in the IF tree in a similar fashion as described above for the RF address MUXes.

Once the decode logic tables are created, a variety of conventional logic synthesizer tools may be used to create hardware specific decode logic from the decode tables which is not necessarily restricted to a PLA-based design.

Assembling the Instruction Unit

In step 512, the CP synthesizer builds the remainder of the instruction unit, including the IUdatapath and the control logic between the IUdatapath and sequencer. In this step, the CP synthesizer allocates the FIFO, ODR, and alignment network by selecting AIR macrocells from the macrocell database and instantiating them. It maps the control ports of these components in the IUdatapath to the control outputs of the IU Control logic. The IU Control logic controls the behavior of the IUdatapath at each cycle by providing specific bit values for each of the control ports of the IUdatapath components. The logic may be specified as a behavioral description of a finite state machine (FSM). From this description, conventional logic synthesis may be used to generate the FSM logic that forms the IUdatapath control logic.

When it allocates the sequencer, the CP synthesizer allocates the sequencer ports responsible for ICache control and addressing and connects it to the corresponding ICache ports (see, e.g., 206, FIG. 2). The number of address lines depends on $\#W_{ICaddr}$ bits, the number of ICache address bits. The memory address register (MAR) 202 drives the address port of the ICache while a fetch request bit (FReq) generated by the IU Control logic controls when new instruction packet fetches are initiated.

The CP synthesizer allocates the FIFO (208, FIG. 2) by computing the size of the FIFO as described above and constructing a macrocell instance from the macrocell database with $N_{FIFO}$ packet registers of width $W_A$ and a number of control and data ports. The data output of the ICache is connected to the data input of the FIFO. The various FIFO control ports are driven by the corresponding ports of the IU Control logic (216, FIG. 2).

The CP synthesizer also allocates the ODR (214, FIG. 2) by constructing a macrocell instance of a register having a width $W_A$ and having corresponding control and data ports. It synthesizes the ODR's input side multiplexor (220, FIG. 2) by constructing a multiplexor from the macrocell database having a width $W_A$. The two inputs of the multiplexor 220 are connected to the FIFO and the ICache respectively. The selection control and the ODR load control ports are driven by the corresponding ports from the IU Control logic (218, 226, FIG. 2).

The CP synthesizer additionally synthesizes the branch FU control and address lines to interconnect the branch control ports of the sequencer with control ports of the branch FU.

Figure 7:
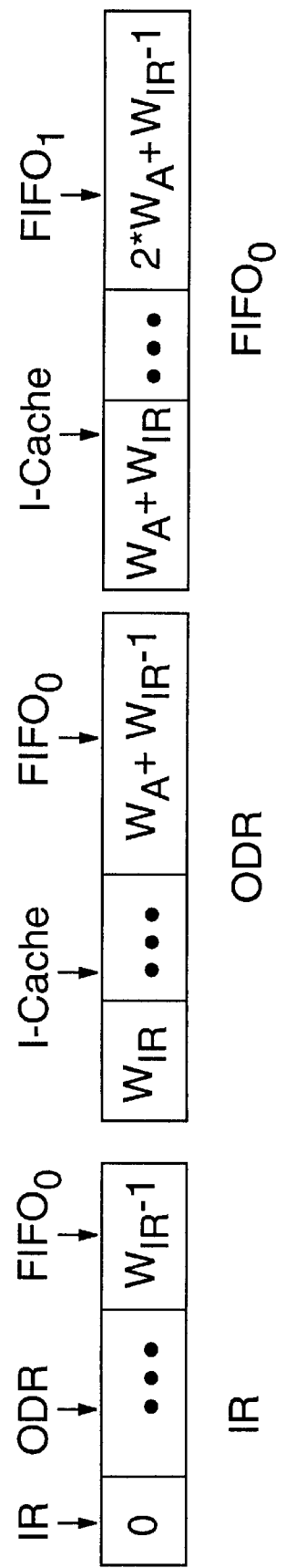
FIG. 7 is a diagram illustrating aspects of the design of an instruction register shift network.

It further allocates the instruction register shift network (230, FIG. 2), and connects its control ports to the IU Control logic (232, FIG. 2). FIG. 7 illustrates aspects of the IUdatapath to illustrate how the CP synthesizer allocates the shift network. In what follows, we assume that the various quanta in the IR, the ODR, the FIFO, and the cache are logically numbered sequentially starting from 0 as shown in FIG. 7.

As explained above, the shift network has a multiplexor for each quantum in the instruction register numbered 0 through $W_{IR}-1$. In the following discussion, k represents the number of a given multiplexor ($0 \leq k \leq W_{IR}-1$).

Each quantum multiplexor k selects among all quanta between the following two extremes:

1) $k+W_{imin}$ (last inst. was minimum size); and
2) $k+W_A+W_{IR}-1$ (last inst. was maximum size and all of ODR was consumed).

The CP synthesizer creates instances for each multiplexor with enough input ports to select among the number of quanta reflected above. This number is $(k+W_A+W_{IR}-1)-(k+W_{imin})+1=W_A+W_{IR}-W_{imin}$.

The choices for IU selection control for a quantum mux k is given by:

1) $k+W_{curr}$ (sequential access and $k+W_{curr}<W_{IR}$);
2) $k+W_{curr}+W_{consumed}$ from ODR/FIFO (sequential access and $k+W_{curr}\geq W_{IR}$); and
3) $k+W_{IR}+P_{target}$ from ODR/FIFO (branch target access).

The choices for IU selection control for ODR/FIFO quantum k is given by:

1) $k+W_A$ from FIFO (advance FIFO by a full packet);
2) $(k-W_{IR}) \% W_A$ from I-Cache output (load directly from I-Cache); and
3) no shift (disable ODR load/FIFO advance).

The CP Synthesizer generates the IU Control logic to control the shift network according to the constraints given above. The design of the IU Control logic is discussed below.

Building IU Control Logic

The instruction fetch protocol described above is implemented in control logic that keeps track of the packet inventory—the packets in flight, packets in the prefetch buffer, and the unconsumed part of the ODR. It also issues instruction cache fetch requests, FIFO load and advance requests, and an ODR load request at the appropriate times, and provides the appropriate selection control for the shift and align network and other multiplexors in the instruction pipeline. Finally, the control logic is also responsible for flushing or stalling the pipeline upon request from the sequencer due to a branch or an interrupt.

The control logic is expressed in the following pseudocode.

| Pseudocode for IU Control Logic |
| --- |
| Module IU Control (cachePktRdy, flushPipe, EOP: in boolean; Wc_err: in integer) |
| 1:  // Design time constants: pktSize ($W_A$), invSize ($\lceil T_A * W_{1max}/W_A \rceil$) |
| 2:  // Internal state: numFIFOPkts(0), numCachePkts(0), $W_{consumed}(W_A)$ |
| 3:  if (numFIFOPkts + numCachePkts<invSize) then |
| 4:    Request I-Cache fetch;                                //launch fetches to keep |
| 5:    numCachePkts++;                                       inventory constant |
| 6:  endif |
| 7:  if (cachePktRdy) then                                   //packets are ready $T_A$ |
| 8:    numCachePkts--;                                       cycles later |
| 9:    if ($W_{consumed} \geq W_A$ && numFIFOPkts > 0) then |
| 10:     Load cachePkt into ODR;                             //put pkt directly into |
| 11:     $W_{consumed}= 0$;                                  ODR, if empty |
| 12:   else                                                  //otherwlse, save pkt in |
| 13:     Load cachePkt into FIFO;                            FIFO |
| 14:     numFIFOPkts**; |
| 15:   endif |
| 16:  endif |
| 17:  if ($W_{consumed} \geq W_A$ && numFIFOPkts>0) then    //draw next pkt from FIFO |
| 18:    Load FIFOPkt into ODR; |
| 19:    $W_{consumed} -= W_A$; |
| 20:    advance FIFO; |
| 21:    numFIFOPkts--; |
| 22:  endif |
| 23:  if (flushPipe) then                                    //branch or interrupt |
| 24:    flush I-cache and FIFO;                              processing |
| 25:    numCachePkts=0; |
| 26:    numFIFOPkts=0; |
| 27:    $W_{consumed}= W_A$ |
| 28:  elseif (EOP) then                                      // skip to end-of-packet |
| 29:    Shift IR to align to next pack boundary; |
| 30:    $W_{consumed} = W_A$; |
| 31:  else                                                   // shift to next |
| 32:    Shift IR by $W_{curr}$';                             instruction |
| 33:    adjust $W_{consumed}$ |
| 34:  endif |

The control logic is expressed as pseudocode that consists of a sequence of conditions and various actions to be performed under those conditions. The logic keeps track of the inventory of packets internally including those in flight in the instruction cache pipeline (numCachePkts) and those sitting in the prefetch buffer (numFIFOPkts). This is used to issue a fetch request whenever the inventory size falls below the threshold (line 3). The corresponding instruction packet is ready to be read at the output of the cache $T_A$ cycles after the fetch is initiated (line 7). This packet may be loaded directly into the ODR if the rest of the pipeline is empty (line 9), or it may be saved in the FIFO (line 12). These packets are later loaded into the ODR as needed (line 17).

Upon encountering a taken branch signal or an interrupt signal from the sequencer (flushPipe), the control logic flushes the instruction pipeline by resetting the internal state (line 23). This enables the pipeline to start fetching instructions from the new address from the next cycle. Otherwise, the next instruction in sequence needs to be aligned into the instruction register (line 28). If the end-of-packet (EOP) bit is set, the current packet residing in the ODR is considered to be fully consumed and the IR is shifted to the next packet available. Otherwise, the IR is shifted by the width of the current instruction. In either case, the multiplexors of the shift and alignment network in front of the IR are provided with the appropriate selection control as described above.

The control logic shown above may be synthesized into a finite-state machine (FSM) using standard synthesis tools that translate a functional description such as that given above and produce a concrete implementation in terms of gates or PLA logic along with control registers to keep track of the sequential state. The control and decode logic specifications may be synthesized into, for example, a FSM, ROM driven table, PLA, discrete gates, etc. as well as combinations of these.

Generating a Structural Description

The system produces a structural description of the control path hardware at the RTL-level in a standard hardware description language such as VHDL. This description can be linked with the respective HDL component libraries pointed to by the macrocell database and processed further for hardware synthesis and simulation.

Conclusion

The control path synthesizer program automatically generates a hardware description of the processor's control path based on data structures representing the processor's instruction format and data path. Additional parameters include ICache parameters such as the cache access time and the width of the unit of cache access. The program instantiates macrocells from a macrocell database for the IUdatapath and synthesizes the control of the IUdatapath based on the instruction width requirements from the instruction format. It further generates decode tables for the decode logic that connects the instruction register to the control ports in the data path.

While we have illustrated a specific control path protocol, it is important to note that the control path synthesizer program can be adapted for a variety of different protocols. Both the structural and procedural aspects of the protocol may vary. The protocol may specify that the alignment network is positioned between the instruction register and the decode logic. In this protocol, for example, the instruction register has a wider width (e.g., a width of one packet) and the alignment network routes varying width instructions from the instruction register to the decode logic. This protocol is based on a procedural model of "in-place" decoding, where instructions are not aligned in the IR, but rather, fall into varying locations in the IR. The protocol procedure defines a methodology to determine the start of the next instruction to be issued from the IR.

The procedural model may be based on a statistical policy where the width of the control path pipeline is optimized based on the width of the templates in the instruction format. In this approach, the control path designer minimizes the width of the pipeline within some performance constraint. For example, the width is allowed to be smaller than the widest instruction or instructions as long as the stall cycles needed to issue these instructions do not adversely impact overall performance. When the width of the pipeline is less than the widest instruction, one or more stall cycles may be necessary to issue the instruction to the decode logic. Performance is estimated based on the time required to issue each instruction and the corresponding frequency of the instruction's issuance.

In addition to variations in the protocol, the specific form of the data structures used to define the instruction format, data path, and control path may vary as well. In the implementation described above, the instruction format is specified in a syntax tree structure. However, other forms of data structures may be used to specify the instruction width requirements, the bit fields of each of the instructions, the bit positions allocated to these fields, and the encodings associated with the fields.

The AIR format is only one possible machine readable hardware description language. It is in the form of C++ classes to make it easier to manipulate with the control path synthesizer program. However, it is possible to express hardware components, their control and data ports, and their interconnects in a variety of languages and data structure formats.

In view of the many possible implementations of the invention, it should be recognized that the implementation described above is only an example of the invention and should not be taken as a limitation on the scope of the invention. Rather, the scope of the invention is defined by the following claims. We therefore claim as our invention all that comes within the scope and spirit of these claims.

We claim:

1. A programmatic method for synthesizing a hardware description of a processor control path from a macrocell library and an instruction format specification, where the programmatic method synthesizes the description according to a predefined control path protocol that defines a methodology for fetching instructions and issuing the instructions to control ports in a data path of the processor, the method:

programmatically extracting instruction width requirements from the instruction format specification of the processor, where the instruction format specification is a data structure specifying the instruction fields of the instructions executed in the processor, including a template select field and at least one opcode field for each instruction in the instruction format, the opcode, source operand and destination operand, and bit positions of the instruction fields in each instruction;

using the extracted instruction width requirements, programmatically generating a description of instruction unit control and data path hardware from the macrocell library for controlling transfer of instructions from an instruction cache to instruction decode logic; and using the instruction format specification and a mapping between instruction fields and processor datapath control ports, programmatially generating a description of decode logic for decoding each of the instructions and issuing control signals to the control ports in the datapath wherein the decode logic is capable of decoding the template select field and providing control signals to map different bit positions in the instruction register to common control ports in the data path of the processor and further includes decode logic for decoding an opcode having a length of n bits and providing control signals to an opcode input port having a length of m bits, where n and m are different.

2. The method of claim 1 wherein an instruction unit datapath includes a prefetch buffer, and further including:

programmatically generating the prefetch buffer using the instruction width requirements and an instruction cache access time.

3. The method of claim 1 wherein an instruction unit control logic comprises an instruction unit control table; and further including:

programmatically generating the instruction unit control table.

4. The method of claim 1 wherein programmatically generating the decode logic for decoding instructions includes:

programmatically extracting a decode table from the instruction format specification where the table specifies input values provided at the fields of the instructions and corresponding output values provided at the control ports in the processor datapath.

5. The method of claim 1 wherein programmatically generating a description of the instruction unit datapath hardware includes:

selecting macrocells from a macrocell library and instantiating macrocell instances with parameter values computed from the extracted instruction width requirements.

6. The method of claim 5 further including:

selecting a prefetch buffer with a width programmatically derived from the instruction width requirements, and a number of registers programmatically derived from the instruction width requirements and cache access time.

7. The method of claim 1 further including:

programmatically synthesizing an instruction alignment network to align an instruction in the instruction register.

8. The method of claim 7 further including: programmatically selecting multiplexors from a macrocell library and instantiating the multiplexors in the alignment network.

9. A computer readable medium having software modules for performing the method of claim 1.

* * * * *